(12) United States Patent
Deng et al.

(10) Patent No.: US 9,918,399 B1
(45) Date of Patent: Mar. 13, 2018

(54) SERVER

(71) Applicants: INVENTEC (PUDONG) TECHNOLOGY CORPORATION, Shanghai (CN); INVENTEC CORPORATION, Taipei (TW)

(72) Inventors: Jian-Jun Deng, Shanghai (CN); Ji-Peng Xu, Shanghai (CN); Yang-Qiu Lai, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 15/414,423

(22) Filed: Jan. 24, 2017

(30) Foreign Application Priority Data

Nov. 22, 2016 (CN) .......................... 2016 1 1026847

(51) Int. Cl.
H05K 7/14 (2006.01)

(52) U.S. Cl.
CPC ................... *H05K 7/1487* (2013.01)

(58) Field of Classification Search
CPC ..................................................... H05K 7/1487
See application file for complete search history.

(56) References Cited

U.S. PATENT DOCUMENTS

| 5,036,481 | A | * | 7/1991 | Lunsford | G06F 1/18 361/679.32 |
| 5,602,721 | A | * | 2/1997 | Slade | G06F 1/18 206/504 |
| 5,604,662 | A | * | 2/1997 | Anderson | G06F 1/184 312/204 |
| 5,801,921 | A | * | 9/1998 | Miller | G06F 1/183 174/72 A |
| 6,728,108 | B2 | * | 4/2004 | Chen | G06F 1/183 361/679.32 |
| 8,576,570 | B2 | * | 11/2013 | Nguyen | G06F 1/181 361/725 |
| 8,743,543 | B2 | * | 6/2014 | Clidaras | G06F 1/20 165/80.4 |
| 8,773,883 | B2 | * | 7/2014 | Harashima | G11O 5/04 361/679.32 |
| 9,335,799 | B2 | * | 5/2016 | Nguyen | G06F 1/181 |
| 9,763,362 | B1 | * | 9/2017 | Xu | H05K 7/1489 |
| 2007/0097612 | A1 | * | 5/2007 | Skinner | G06F 13/4095 361/679.32 |

(Continued)

*Primary Examiner* — Lisa Lea Edmonds

(74) *Attorney, Agent, or Firm* — Maschoff Brennan

(57) ABSTRACT

A server adapted to a server rack. The server rack has a first and a second connectors at a rear end of the server rack. The server comprises a tray, a motherboard, an expansion board, an adaption board, a system board, a docking module and a first cable. The motherboard comprises a central processing unit. The motherboard, the expansion, the adaption board and the system board are disposed on the tray. The docking module comprises a third and a fourth connectors. The fourth connector is configured for electrically connected to the first connector, and the third connector is configured for electrically connected to the second connector. One end of the first cable is connected to one end of the third connector, and the other end of the first cable is connected to the adaption board. The first cable is electrically connected to the third connector and the adaption board.

10 Claims, 4 Drawing Sheets

(56) References Cited

U.S. PATENT DOCUMENTS

2012/0120586 A1\* 5/2012 Katata ................... G06F 13/409
                                                        361/679.32
2015/0092788 A1\* 4/2015 Kennedy ................ G06F 1/185
                                                        370/419

\* cited by examiner

SERVER

CROSS-REFERENCE TO RELATED APPLICATIONS

This non-provisional application claims priority under 35 U.S.C. § 119(a) on Patent Application No(s). 201611026847.2 filed in China. on Nov. 22, 2016, the entire contents of which are hereby incorporated by reference.

Technical Field

This disclosure relates to a server, more particularly to a server adapted for a server rack.

Background

With the development of information technology, the development of servers is becoming trendy. There are a single-node type and a multi-node type rack-mount computer server. In a conventional server rack, one or more servers are able to be plugged into or replaced according to actual requirements, so the server and the rack respectively have connectors for being connected to each other.

SUMMARY

One embodiment of the disclosure provides a server adapted to a server rack. The server rack has a first connector and a second connector at a rear end of the server rack. The server comprises a tray, a motherboard, an expansion board, an adaption board, a system board, a docking module and a first cable. The tray has a first side and a second side opposite to each other. The motherboard comprises a central processing unit and the motherboard disposed on the tray. The expansion board is disposed on the tray and is located between the first side and the central processing unit. The adaption board is disposed on the tray and is located between the second side and the motherboard. The system board is disposed on the tray and is located between the second side and the motherboard. The docking module is disposed on the second side. The docking module comprises a third connector and a fourth connector. The fourth connector is configured for electrically connected to the first connector of the server rack, and the third connector is configured for electrically connected to the second connector of the server rack. One end of the first cable is directly connected to one end of the third connector, and the other end of the first cable is connected to the adaption board. The first cable is electrically connected to the third connector and the adaption board.

One embodiment of the disclosure provides a server, wherein the tray further has a third side and a fourth side, which are opposite to each other and located between the first side and the second side. The motherboard comprises a main portion and an extending portion. The extending portion is located between the first side and the main portion. The extending portion is closer to the third side than the expansion board is to the third side, and the system board is closer to the third side than the adaption board is to the third side.

One embodiment of the disclosure provides a server further comprising an expansion card disposed on the motherboard and located adjacent to the first side.

One embodiment of the disclosure provides a server further comprising a reinforcing structure disposed between the motherboard and the tray. The reinforcing structure has an extension direction pointing towards the second side and substantially perpendicular to the first side.

One embodiment of the disclosure provides a server further comprising a storage unit electrically connected to the expansion board and located between the expansion board and the first side.

One embodiment of the disclosure provides a server further comprising a flow guiding structure. The tray further has a third side and a fourth side, which are opposite to each other and located between the first side and the second side. The motherboard is closer to the third side than the fourth side. One end of the flow guiding structure is fixed at the fourth side, and the other end of the flow guiding structure is plugged into the motherboard.

One embodiment of the disclosure provides a server, wherein the motherboard is electrically connected to the expansion board, the adaption board and the system board.

One embodiment of the disclosure provides a server further comprising a second cable. One side of the fourth connector is configured for electrically connected to the first connector of the server rack, and the other side of the fourth connector is configured for electrically connected to the adaption board through the second cable.

One embodiment of the disclosure provides a server, wherein the motherboard comprises a handle and a circuit board. The circuit board is disposed on the tray. The central processing unit and the handle are disposed on the circuit board.

One embodiment of the disclosure provides a server, wherein the motherboard is detachably and toollessly disposed on the tray. The expansion board is detachably and toollessly disposed on the tray. The adaption board is detachably and toollessly disposed on the tray. The system board is detachably and toollessly disposed on the tray.

BRIEF DESCRIPTION OF THE DRAWINGS

The present disclosure will become more fully understood from the detailed description given hereinbelow and the accompanying drawings which are given by way of illustration only and thus are not intending to limit the present disclosure and wherein.

DETAILED DESCRIPTION

Figure 1:
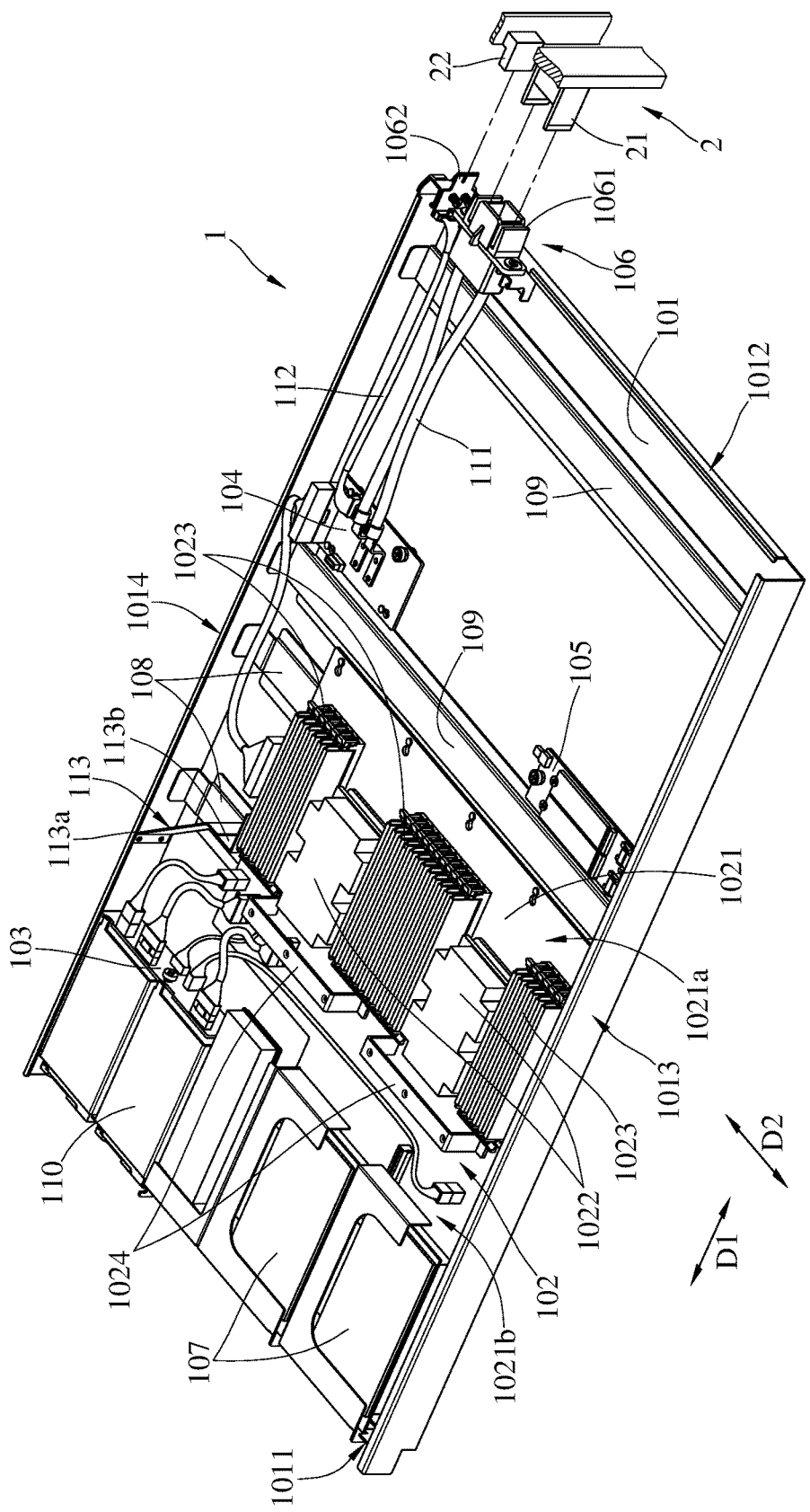
FIG. 1 is a perspective view of a server and a server rack in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The drawings may not be drawn to actual size or scale, some exaggerations may be necessary in order to emphasize basic structural relationships, while some are simplified for clarity of understanding, and the present disclosure is not limited thereto. It is allowed to have various adjustments under the spirit of the present disclosure. In the specification, the term "on" may be described as "one is located above another" or "one is in contact with another". In addition, the terms "top side", "bottom side", "above" and "below" are used to illustrate but limit the present disclosure. The term "substantially" is referred to the complete or nearly complete extent or degree of a structure, which means that it is allowable to have tolerance during manufacturing.

Figure 2:
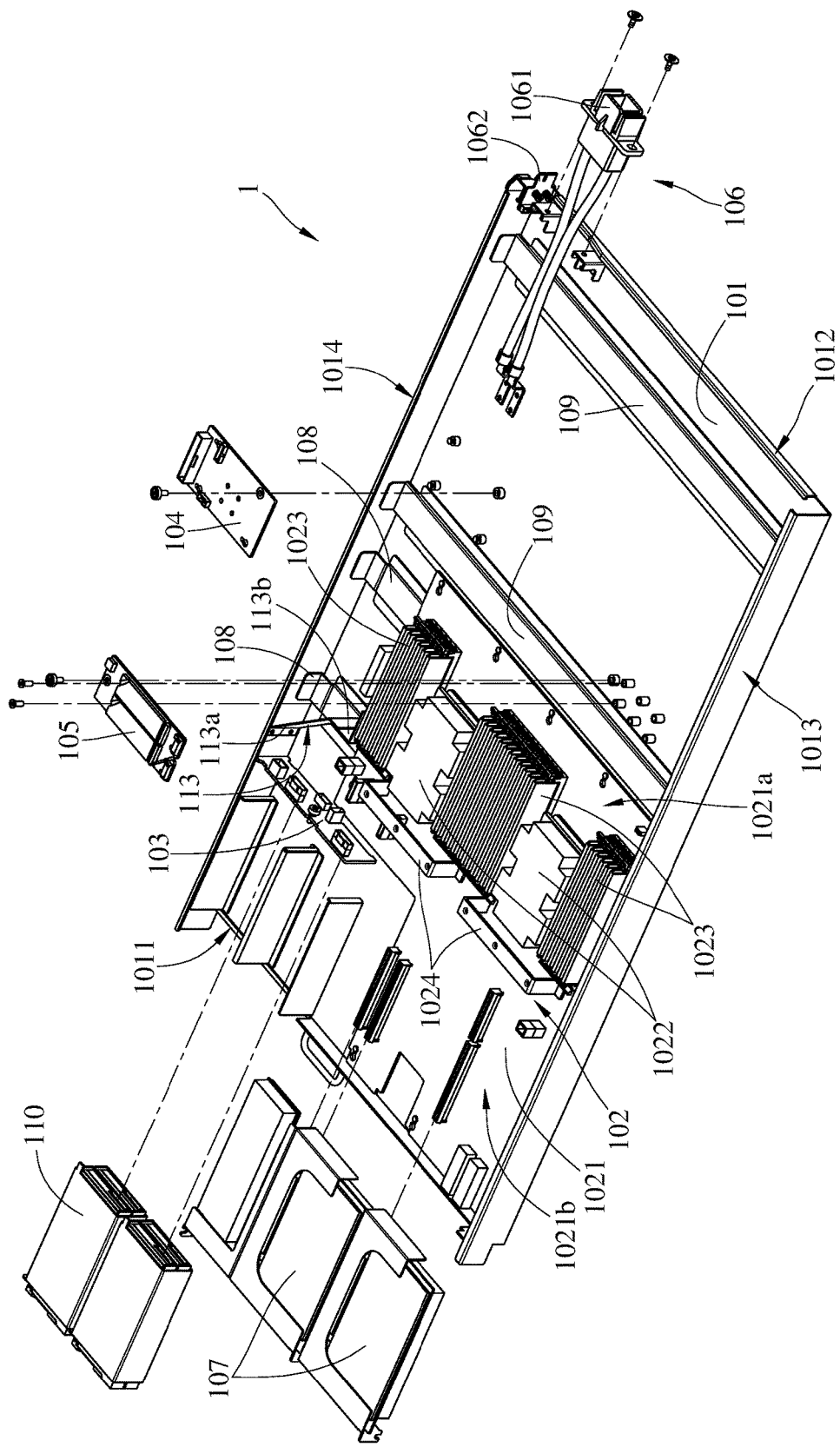
FIG. 2 is an exploded view of the server in FIG. 1.
Figure 3:
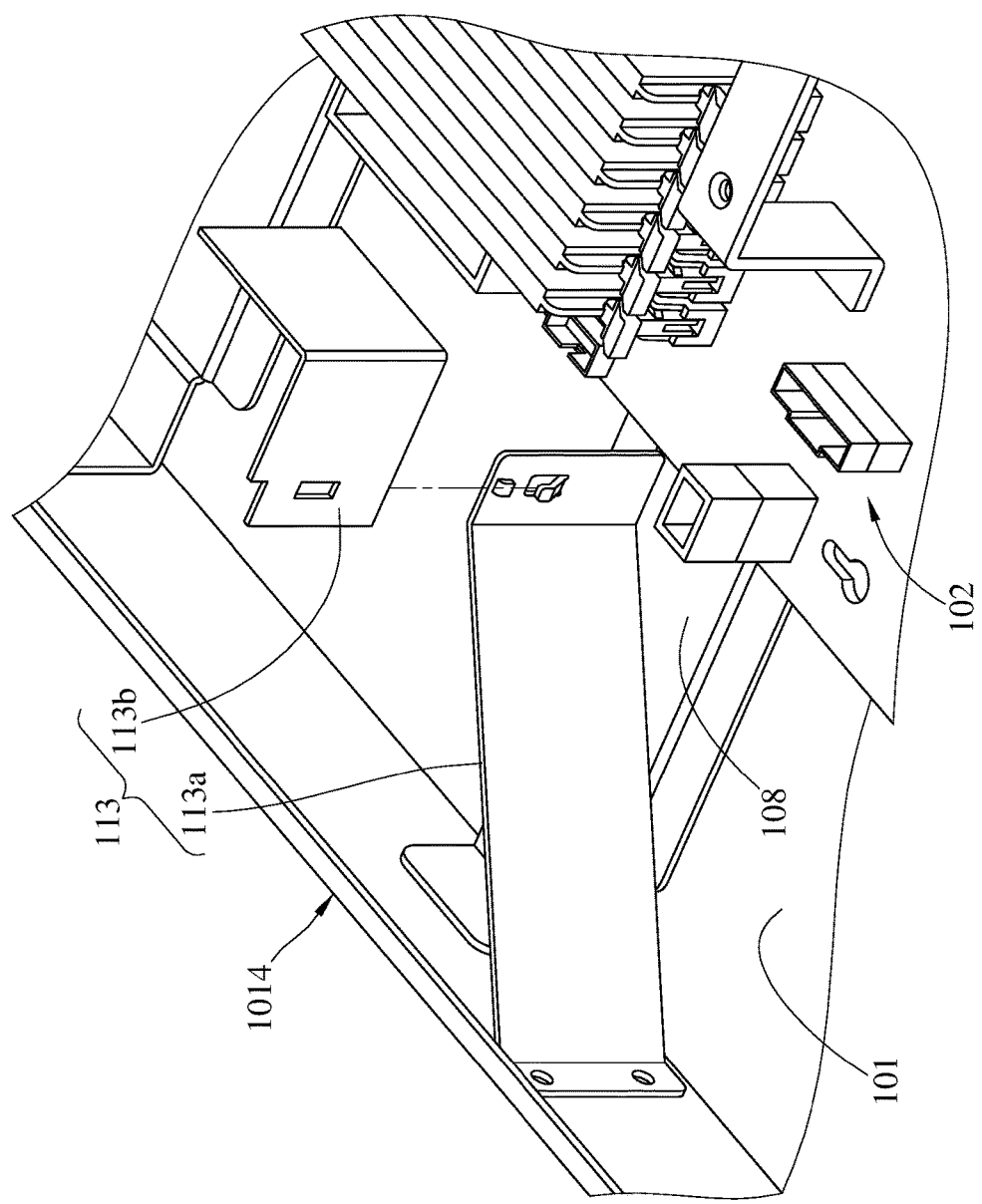
FIG. 3 is a partial enlarged and further exploded view of the server in FIG. 2 taken from another point of view.

Please refer to FIG. 1 to FIG. 3. FIG. 1 is a perspective view of a server and a server rack in accordance with one embodiment of the disclosure, FIG. 2 is an exploded view of the server in FIG. 1, and FIG. 3 is a partial enlarged and further exploded view of the server in FIG. 2 taken from another point of view. As shown in FIG. 1 and FIG. 2, a server 1 is configured for a server rack 2. The server rack 2 has a second connector 21 and a first connector 22 at a rear end of the server rack 2. The second connector 21 has two conductive sheets, and the second connector 21 is configured to supply electric power to the server 1. The first connector 22 is configured to transmit signals to a fan wall (not shown) of the server rack 2, thereby controlling heat dissipation. The server 1 includes a tray 101, a motherboard 102, an expansion board 103, an adaption board 104, a system board 105, a docking module 106, two expansion cards 107, two first reinforcing structures 108, two second reinforcing structures 109, two storage units 110, a first cable 111, a second cable 112 and a flow guiding structure 113.

The tray 101 has a first side 1011, a second side 1012, a third side 1013 and a fourth side 1014. The first side 1011 and the second side 1012 are opposite to each other. The third side 1013 and the fourth side 1014 are opposite to each other and located between the first side 1011 and the second side 1012. A first direction D1 either points from the first side 1011 toward the second side 1012 or points from the second side 1012 toward the first side 1011; that is, the first direction D1 either points from the first side 1011 toward the second side 1012 or points in the opposite direction. An airflow generated by the fan wall of the server rack 2 flows along a direction substantially parallel to the first direction D1.

The motherboard 102 is disposed on the tray 101 and is closer to the fourth side 1014 than the third side 1013. The motherboard 102 includes a circuit board 1021, two central processing units 1022, a plurality of memory chips 1023 and two handles 1024. The circuit board 1021 of the motherboard 102 is detachably and toollessly disposed on the tray 101. The term "toollessly", as used herein, means "without the use of any tool". The circuit board 1021 includes a main portion 1021a and an extending portion 1021b. The extending portion 1021b is located between the first side 1011 and the main portion 1021a, and is close to the third side 1013. The central processing units 1022 and the memory chips 1023 are disposed on the circuit board 1021 and located at the main portion 1021a. Each memory chip 1023 is placed parallel to the first direction D1. In detail, the memory chips 1023 are arranged with its length direction substantially parallel to the first direction D1. The central processing units 1022 are interspersed between the memory chips 1023. The handles 1024 are disposed on the main portion 1021a of the circuit board 1021. The handles 1024 are configured for being gripped. When the motherboard 102 is detached from the tray 101, the user is able to easily detach the motherboard 102 from the tray 101 while gripping the handles 1024. A reinforcing structure is not shown in figure because it is covered by the circuit board 1021. The handles 1024 are fastened to the tray 101 through the circuit board 1021, so that the circuit board 1021 is fixed in place.

The expansion board 103 is detachably and toollessly disposed on the tray 101, and the expansion board 103 is located between the first side 1011 and the main portion 1021a of the circuit board 1021. In detail, the expansion board 103 is located between the first side 1011 and the central processing units 1022 disposed on the main portion 1021a. The expansion board 103 stands on the tray 101. The motherboard 102 is electrically connected to the expansion board 103. The extending portion 1021b of the circuit board 1021 of the motherboard 102 is closer to the third side 1013 than the expansion board 103 is to the third side 1013. In other words, the expansion board 103 is closer to the fourth side 1014 than the extending portion 1021b is to the fourth side 1014.

The adaption board 104 is detachably and toollessly disposed on the tray 101, and the adaption board 104 is located between the second side 1012 and the motherboard 102. The motherboard 102 is electrically connected to the adaption board 104. The adaption board 104 is configured to convert electric power and signals to the motherboard 102.

The system board 105 is detachably and toollessly disposed on the tray 101, and the system board 105 is disposed between the second side 1012 and the motherboard 102. The motherboard 102 is electrically connected to the system board 105. The system board 105 is closer to the third side 1013 than the adaption board 104 is to the third side 1013. In other words, the adaption board 104 is closer to the fourth side 1014 than the system board 105 is to the fourth side 1014.

The docking module 106 is disposed on the second side 1012. The docking module 106 includes a third connector 1061 and a fourth connector 1062. The second connector 21 of the server rack 2 is configured for electrically connected to the third connector 1061 of the docking module 106, and the fourth connector 1062 of the docking module 106 is configured for electrically connected to the first connector 22 of the server rack 2. In detail, the second connector 21 of the server rack 2 is able to be plugged into the third connector 1061 of the docking module 106, and the fourth connector 1062 of the docking module 106 is able to be plugged into the first connector 22 of the server rack 2.

The expansion cards 107 are disposed on the extending portion 1021b of the circuit board 1021 of the motherboard 102, and the expansion cards 107 are located adjacent to the first side 1011. The expansion cards 107 have a plurality of connection ports which are configured for being electrically connected to other servers.

The first reinforcing structures 108 and the second reinforcing structures 109 are disposed on the tray 101. Each first reinforcing structure 108 and each second reinforcing structure 109 extend in an extension direction substantially parallel to a second direction D2. The second direction D2 is substantially perpendicular to the first direction D1. The first reinforcing structures 108 are made of, for example, insulating material. The second reinforcing structures 109 is made of, for example, insulating or non-insulating material. The first reinforcing structures 108 are closer to the first side 1011 than the second reinforcing structures 109 are to the first side 1011. When the motherboard 102 is being disposed on the tray 101, the first reinforcing structures 108 are located between the circuit board 1021 of the motherboard 102 and the tray 101, and a part of each first reinforcing structure 108 is not covered by the circuit board 1021 of the motherboard 102. The second reinforcing structures 109 are not covered by the circuit board 1021 of the motherboard 102. The first reinforcing structures 108 and the second reinforcing structures 109 are configured to reinforce the mechanical strength of the tray 101. In addition, since the first reinforcing structures 108 are located between the circuit board 1021 of the motherboard 102 and the tray 101, the airflow from the fan wall is being blocked and prevented from flowing through an area between the circuit board 1021 and the tray 101. Thus, most of the airflow from the fan wall is able to flow through the central processing units 1022 of the motherboard 102, which is favorable for dissipating the heat generated by the central processing units 1022.

The storage units 110 are electrically connected to the expansion board 103, and the storage units 110 are located between the expansion board 103 and the first side 1011. The storage units 110 are electrically connected to the motherboard 102 through the expansion board 103.

One end of the first cable 111 is directly connected to one end of the third connector 1061 of the docking module 106, and the other end of the first cable 111 is connected to the adaption board 104. The first cable 111 is electrically connected to the third connector 1061 and the adaption board 104. One side of the fourth connector 1062 of the docking module 106 is configured for being plugged into the first connector 22 of the server rack 2. The other side of the fourth connector 1062 is electrically connected to the adaption board 104 through the second cable 112. Electric power is transmitted to the adaption board 104 through the second connector 21 of the server rack 2, the third connector 1061 of the docking module 106 and the first cable 111. The adaption board 104 is configured to convert electric power to the motherboard 102. Signals is transmitted to the adaption board 104 through the first connector 22 of the server rack 2, the fourth connector 1062 of the docking module 106 and the second cable 112. The adaption board 104 is configured to convert signals to the motherboard 102. Signals are able to be transmitted in the opposite direction through the same path.

As shown in FIG. 1 to FIG. 3, the flow guiding structure 113 includes a fixed part 113a and a connection part 113b. One end of the fixed part 113a is fixed at the fourth side 1014. One end of the connection part 113b is detachably plugged into the other end of the fixed part 113a which is away from the fourth side 1014. The other end of the connection part 113b is located at the motherboard 102. The connection part 113b is made of, for example, flexible plastic materials.

Figure 4:
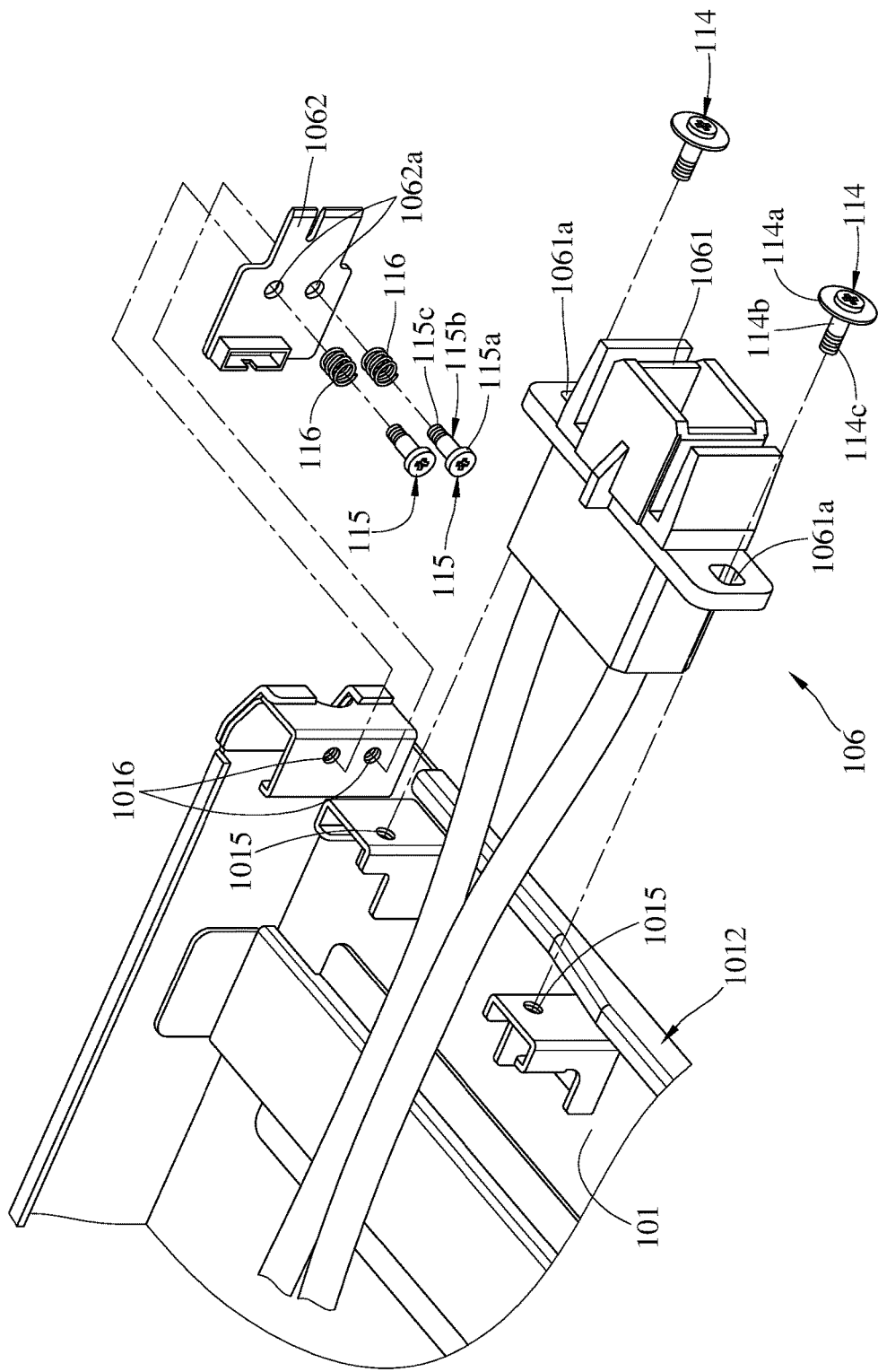
FIG. 4 is a partial enlarged and further exploded view of the server in FIG. 2.

Please refer to FIG. 4, which is a partial enlarged and further exploded view of the server in FIG. 2. The server 1 further includes two first screw bolts 114, two second screw bolts 115 and two elastic components 116. Each first screw bolt 114 includes a first head portion 114a, a first shank portion 114b and a first thread portion 114c which are connected in sequence. Each second screw bolt 115 includes a second head portion 115a, a second shank portion 115b and a second thread portion 115c which are connected in sequence. The tray 101 has two first fixing holes 1015 and two second fixing holes 1016. The first fixing holes 1015 and the second fixing holes 1016 are screw holes. The third connector 1061 of the docking module 106 has two third fixing holes 1061a in a square shape, and the minimum inner diameter of the third fixing holes 1061a is smaller than a width of the first head portion 114a of the first screw bolts 114 and is slightly larger than a width of the first shank portion 114b and a width of the first thread portion 114c. The fourth connector 1062 of the docking module 106 has two fourth fixing holes 1062a.

The first screw bolt 114 passes through the third fixing holes 1061a of the third connector 1061, and is fastened to the first fixing holes 1015 of the tray 101 through the first thread portion 114c. Since the shape of the third fixing holes 1061a is square and its minimum inner diameter is slightly larger than the first shank portion 114b and the thread portion 114c of the first screw bolts 114, the third connector 1061 is able to be slightly movably fixed at the tray 101, thereby reducing the impact or vibration transmitted to the tray 101 from the third connector 1061. In this embodiment, the first screw bolt 114 includes the first head portion 114a, the first shank portion 114b and the first thread portion 114c which are connected in sequence, but the present disclosure is not limited thereto. In other embodiment, the first screw bolt 114 may have no first shank portion 114b, only include the first head portion 114a and the first thread portion 114c directly connected to each other.

The second screw bolt 115 passes through the elastic components 116 and the fourth fixing holes 1062a of the fourth connector 1062, and is fastened to the second fixing holes 1016 of the tray 101 through the second thread portion 115c. The elastic components 116 respectively surround the second shank portions 115b. Two ends of each elastic component 116 are respectively pressed by the second head portion 115a and the fourth connector 1062. Therefore, the fourth connector 1062 is able to be slightly movably fixed at the tray 101. When the fourth connector 1062 is being struck or vibrated, there is a room for the fourth connector 1062 to move toward the second head portion 115a of the second screw bolts 115, thereby reducing the impact or vibration transmitted to the tray 101 from the fourth connector 1062.

According to the server as discussed above, one end of the first cable is directly connected to one end of the third connector, and the other end of the first cable is connected to the adaption board, so that the impact or vibration transmitted to the adaption board from the third connector of the docking module is reduced.

In addition, the second cable is electrically connected to the fourth connector and the adaption board, so that the impact or vibration transmitted to the adaption board from the fourth connector of the docking module is able to be reduced as well. Thus, it is favorable for maintaining the electricity and signal transmissions between the server and the server rack, and preventing the circuit board from being damaged.

Furthermore, the reinforcing structure is disposed between the motherboard and the tray, and the flow guiding structure is disposed between the fourth side and the motherboard, so that most of the airflow from the fan wall is able to flow through the central processing units of the motherboard, and therefore favorable for dissipating the heat generated by the central processing units.

Moreover, the handles of the motherboard are favorable for the motherboard being replaced.

Also, some of the server components are able to be detached or mounted without using tool, and it is favorable for the maintenance of the server. Wherein, the third connector and the fourth connector of the docking module are slightly movably fixed at the tray, so that the impact or vibration transmitted to the tray from the third connector and the fourth connector is able to be reduced.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A server, adapted to a server rack, the server rack having a first connector and a second connector at a rear end of the server rack, the server comprising:

a tray having a first side and a second side opposite to each other;

a motherboard comprising a central processing unit, and the motherboard disposed on the tray;

an expansion board disposed on the tray and located between the first side and the central processing unit;

an adaption board disposed on the tray and located between the second side and the motherboard;

a system board disposed on the tray and located between the second side and the motherboard;

a docking module disposed on the second side, the docking module comprising a third connector and a fourth connector, the fourth connector configured for electrically connected to the first connector of the server rack, and the third connector configured for electrically connected to the second connector of the server rack; and a first cable, one end of the first cable directly connected to one end of the third connector, the other end of the first cable connected to the adaption board, and the first cable electrically connected to the third connector and the adaption board.

2. The server according to claim 1, wherein the tray further has a third side and a fourth side, which are opposite to each other and located between the first side and the second side, the motherboard comprises a main portion and an extending portion, the extending portion is located between the first side and the main portion, the extending portion is closer to the third side than the expansion board is to the third side, and the system board is closer to the third side than the adaption board is to the third side.

3. The server according to claim 1, further comprising an expansion card, disposed on the motherboard, and located adjacent to the first side.

4. The server according to claim 1, further comprising a reinforcing structure disposed between the motherboard and the tray, the reinforcing structure having an extension direction pointing towards the second side and substantially perpendicular to the first side.

5. The server according to claim 1, further comprising a storage unit electrically connected to the expansion board and located between the expansion board and the first side.

6. The server according to claim 1, further comprising a flow guiding structure, the tray further having a third side and a fourth side, which are opposite to each other and located between the first side and the second side, the motherboard being closer to the third side than the fourth side, one end of the flow guiding structure fixed at the fourth side, and the other end of the flow guiding structure plugged into the motherboard.

7. The server according to claim 1, wherein the motherboard is electrically connected to the expansion board, the adaption board and the system board.

8. The server according to claim 1, further comprising a second cable, one side of the fourth connector configured for electrically connected to the first connector of the server rack, and the other side of the fourth connector configured for electrically connected to the adaption board through the second cable.

9. The server according to claim 1, wherein the motherboard comprises a handle and a circuit board, the circuit board is disposed on the tray, and the central processing unit and the handle are disposed on the circuit board.

10. The server according to claim 1, wherein the motherboard is detachably and toollessly disposed on the tray, the expansion board is detachably and toollessly disposed on the tray, the adaption board is detachably and toollessly disposed on the tray, the system board is detachably and toollessly disposed on the tray.

* * * * *